US012664454B2

(12) United States Patent
Hasegawa et al.

(10) Patent No.: US 12,664,454 B2
(45) Date of Patent: Jun. 23, 2026

(54) SUPERCONDUCTING CIRCUIT AND QUANTUM COMPUTER

(71) Applicant: NEC Corporation, Tokyo (JP)

(72) Inventors: Masahiro Hasegawa, Tokyo (JP); Tsuyoshi Yamamoto, Tokyo (JP); Yoshihito Hashimoto, Tokyo (JP)

(73) Assignee: NEC CORPORATION, Tokyo (JP)

( * ) Notice: Subject to any disclaimer, the term of this patent is extended or adjusted under 35 U.S.C. 154(b) by 1199 days.

(21) Appl. No.: 17/626,967

(22) PCT Filed: Jun. 26, 2020

(86) PCT No.: PCT/JP2020/025248
§ 371 (c)(1),
(2) Date: Jan. 13, 2022

(87) PCT Pub. No.: WO2021/014888
PCT Pub. Date: Jan. 28, 2021

(65) Prior Publication Data
US 2022/0261680 A1      Aug. 18, 2022

(30) Foreign Application Priority Data

Jul. 19, 2019    (JP) .................................. 2019-133818

(51) Int. Cl.
*G06N 10/40*        (2022.01)
*G06N 10/60*        (2022.01)
(Continued)

(52) U.S. Cl.
CPC ............. *G06N 10/40* (2022.01); *G06N 10/60* (2022.01); *H03K 17/92* (2013.01); *H10N 69/00* (2023.02)

(58) Field of Classification Search
CPC ........ G06N 10/40; G06N 10/20; G06N 10/60; G06N 10/70; G06N 10/80; G06N 10/00;
(Continued)

(56) References Cited

U.S. PATENT DOCUMENTS 7,305,879 B2 * 12/2007 Moody ..................... G01V 7/16
73/514.31
9,780,765 B2 * 10/2017 Naaman ................... H03K 3/38
(Continued)

FOREIGN PATENT DOCUMENTS

AU        2006255515 A1 * 12/2006   ............. G06N 10/40
CA        2593093 A1 *  7/2006   ............. H10N 60/12
(Continued)

OTHER PUBLICATIONS

"A quantum engineer's guide to superconducting qubits," Appl. Phys. Rev. 6, 021318 (Jun. 17, 2019) https://pubs.aip.org/aip/apr/article/6/2/021318/570326/A-quantum-engineer-s-guide-to-superconducting (Year: 2019).*
(Continued)

*Primary Examiner* — Steven P Sax
(74) *Attorney, Agent, or Firm* — Sughrue Mion, PLLC

(57)        ABSTRACT

A superconducting circuit and a quantum computer capable of implementing four-body interaction while reducing an amount of hardware are provided. A superconducting circuit (1) includes four superconducting qubit circuits (10), a coupling circuit (20) inductively coupled to the four superconducting qubit circuits (10). Each of the superconducting qubit circuits (10) indicates a qubit by being in a first phase state or a second phase state, when the number of the superconducting qubit circuits (10) in the first phase state among the four superconducting qubit circuits (10) is an even number, an interaction term of Hamiltonian of the superconducting circuit (1) takes a first value, and when the
(Continued)

number of the superconducting qubit circuits (10) in the first phase state among the four superconducting qubit circuits (10) is an odd number, the interaction term takes a second value.

9 Claims, 7 Drawing Sheets

(51) Int. Cl.
  *H03K 17/92*     (2006.01)
  *H10N 69/00*     (2023.01)

(58) Field of Classification Search
  CPC ........ H10N 69/00; H10N 60/12; H03K 17/92;
    H03K 19/195; H01J 37/2426; H10D
    64/608; Y10S 505/703; H01S 3/1683;
    H01L 23/535; G11C 11/44; H04L 27/36
  See application file for complete search history.

(56)            References Cited

U.S. PATENT DOCUMENTS

| | | | | |
|---|---|---|---|---|
| 10,074,792 | B1 * | 9/2018 | Ferguson | H03K 19/1952 |
| 10,572,816 | B1 * | 2/2020 | Vavilov | G06N 10/70 |
| 2006/0147154 | A1 * | 7/2006 | Thom | H10N 60/12 385/37 |
| 2010/0085827 | A1 * | 4/2010 | Thom | H10N 60/12 977/933 |
| 2010/0148853 | A1 * | 6/2010 | Harris | B82Y 10/00 326/4 |
| 2014/0274725 | A1 * | 9/2014 | Abraham | H01L 23/535 505/170 |
| 2018/0240034 | A1 | 8/2018 | Harris | |
| 2018/0341874 | A1 * | 11/2018 | Puri | G06N 10/40 |
| 2020/0202248 | A1 * | 6/2020 | Mezzacapo | H03H 7/18 |

FOREIGN PATENT DOCUMENTS

| | | | | |
|---|---|---|---|---|
| CA | 3010686 | A1 * | 9/2017 | G11C 11/44 |
| CA | 2968830 | A1 * | 11/2018 | G06N 5/01 |
| CA | 3101348 | A1 * | 1/2020 | H03K 19/1952 |
| CA | 3137517 | A1 * | 11/2020 | G06N 10/20 |
| CA | 2977664 | C * | 10/2023 | H01P 1/38 |
| CN | 100585629 | C * | 1/2010 | |
| CN | 103928214 | A * | 7/2014 | |
| CN | 107004755 | A * | 8/2017 | H01L 21/76891 |
| CN | 107872139 | A * | 4/2018 | H02K 37/10 |
| CN | 107611249 | B * | 11/2021 | |
| DE | 112012005798 | B4 * | 7/2023 | G11C 11/44 |
| EP | 3577693 | B1 * | 7/2021 | H03K 3/38 |
| GB | 2553848 | A * | 3/2018 | H01F 38/14 |
| JP | 2004533061 | A * | 10/2004 | G06N 10/40 |
| JP | 2007049009 | A * | 2/2007 | |
| JP | 2008108927 | A * | 5/2008 | |
| JP | 4094171 | B2 * | 6/2008 | |
| JP | 2018-533106 | A | 11/2018 | |
| JP | 2020178078 | A * | 10/2020 | |
| KR | 101224442 | B1 * | 1/2013 | H10N 60/12 |
| KR | 20190113963 | A * | 10/2019 | H03K 19/195 |
| WO | WO 02086813 | A3 * | 5/2003 | |
| WO | WO-03054793 | A2 * | 7/2003 | G06N 10/40 |
| WO | WO-2010148990 | A1 * | 12/2010 | H02K 49/108 |
| WO | WO-2017031357 | A1 * | 2/2017 | G06N 3/08 |
| WO | WO-2018159832 | A1 * | 9/2018 | H04L 27/36 |

OTHER PUBLICATIONS

International Search Report for PCT Application No. PCT/JP2020/025248, mailed on Sep. 24.2020.
W. Lechner, et al., "A quantum annealing architecture with all-to-all connectivity from local interactions", Science Advances 23, 2015, vol. 1, No. 9, e1500838, pp. 1-6.
N. Chancellor, et al., "Circuit design for multi-body interactions in superconducting quantum annealing systems with applications to a scalable architecture." quantum information, 3:21, pp. 1-11, Sep. 12, 2018.
N. Chancellor, et al., "Circuit design for multi-body interactions in superconducting quantum annealing systems with applications to a scalable architecture," arXiv:1603.09521v5, Oct. 13, 2017 [retrieved on Sep. 11, 2020], pp. 1-7.

* cited by examiner

1

10

21

3

4

4

SUPERCONDUCTING CIRCUIT AND QUANTUM COMPUTER

This application is a National Stage Entry of PCT/JP2020/025248 filed on Jun. 26, 2020, which claims priority from Japanese Patent Application 2019-133818 filed on Jul. 19, 2019, the contents of all of which are incorporated herein by reference, in their entirety.

TECHNICAL FIELD

The present disclosure relates to a superconducting circuit and a quantum computer.

BACKGROUND ART

Solving a combinatorial optimization problem can be replaced by finding a ground state of the Ising model, in other words, finding the state of each spin that minimizes the Hamiltonian of the Ising model. Here, the Ising model is a system in which a plurality of spins capable of being in either an upward or downward state interact with each other. The quantum annealing circuit (the quantum annealing computer) realizes this Ising model as a circuit, and this circuit is constituted by coupling a plurality of qubit circuits regarded as spins to each other. Each qubit circuit can be in either an upward or a downward state.

In order to improve the performance of the quantum annealing circuit, it is required to couple all the qubit circuits, that is, to couple all the qubit circuits with all the qubit circuits other than the qubit circuit of interest. However, the greater the number of bits in the quantum annealing circuit, i.e., the number of qubit circuits, the more difficult it is to implement full coupling in hardware. As a method for solving this difficulty, full coupling by a method called an LHZ scheme has been proposed (Non Patent Literature 1). In the LHZ scheme, two interacting spins are replaced with a single spin to visually eliminate the interaction between the spins and simplify the implementation of full coupling in hardware. However, it is necessary to satisfy a constraint. This constraint is for the interaction between four spins and is called a four-body interaction. In order to form a quantum annealing circuit in accordance with the LHZ scheme, this four-body interaction must be implemented in hardware. As a method of implementing the four-body interaction, Non Patent Literature 2 describes a configuration of four-body interaction using a superconducting qubit circuit.

CITATION LIST

Non Patent Literature

Non Patent Literature 1: W. Lechner, et al., "A quantum annealing architecture with all-to-all connectivity from local interactions", Science Advances 23, 2015, Vol. 1, no. 9, e1500838.

Non Patent Literature 2: N. Chancellor, et al., "Circuit design for multi-body interactions in superconducting quantum annealing systems with applications to a scalable architecture", quantum information, 3:21, pp. 1-7, 2017.

SUMMARY OF INVENTION

Technical Problem

However, in the method described in Non Patent Literature 2, not only four qubit circuits but also four auxiliary qubit circuits must be used in order to implement the four-body interaction. This lead to a problem that the number of qubit circuits is doubled. To solve this problem, it is required to implement four-body interaction with less hardware.

An object of the present disclosure is to provide a superconducting circuit and a quantum computer capable of implementing four-body interaction while reducing an amount of hardware.

Solution to Problem

In an example aspect, a superconducting circuit includes:
four superconducting qubit circuits; and
a coupling circuit inductively coupled to the four superconducting qubit circuits.

Each of the superconducting qubit circuits indicates a qubit by being in a first phase state or a second phase state,
when the number of the superconducting qubit circuits in the first phase state among the four superconducting qubit circuits is an even number, an interaction term of Hamiltonian of the superconducting circuit takes a first value, and
when the number of the superconducting qubit circuits in the first phase state among the four superconducting qubit circuits is an odd number, the interaction term takes a second value.

In another example aspect, a superconducting circuit includes:
a plurality of superconducting qubit circuits; and
a coupling circuit inductively coupled to the plurality of superconducting qubit circuits.

The coupling circuit includes a plurality of loop circuits each including an inductor and a Josephson junction;
the inductor is a positive direction inductor inductively coupled to any of the superconducting qubit circuits and is inserted therein so that a current flows in the same direction as a direction of a current in the loop circuit or a reverse direction inductor inductively coupled to any of the superconducting qubit circuits and is inserted therein so that a current flows in a direction opposite to the direction of the current in the loop circuit, and
a combination of types of the inductors used in the inductive coupling between one of the superconducting qubit circuits and the plurality of loop circuits differs for each superconducting qubit circuit.

Advantageous Effects of Invention

According to the above configuration, it is possible to provide a superconducting circuit and a quantum computer capable of implementing four-body interaction while reducing an amount of hardware.

EXAMPLE EMBODIMENTS

The details of the example embodiments will be described below. A superconducting circuit according to example embodiments is implemented, for example, by lines which are wiring composed of a superconductor on a silicon substrate. For example, niobium (Nb) or aluminum (Al) is used as a material of these lines, but any other metal which becomes a superconducting state when cooled to a very low temperature such as molybdenum (Mo) or tantalum (Ta) may be used. In order to achieve the superconducting state, a superconducting circuit is used in a temperature environment of, for example, about 10 milli-Kelvin (mK) achieved by a refrigerator.

In the following description, a Josephson junction refers to an element having a structure in which a thin insulating film is sandwiched between a first superconductor and a second superconductor.

The Hamiltonian of a plurality of qubit circuits is a sum of terms related to interaction between the qubit circuits, which are hereinafter referred to as interaction terms, and terms not related to the interaction. In order to satisfy the above-mentioned constraint, the four-body interaction terms, namely, the terms indicating the interaction of the four qubit circuits, must have the following characteristics. The characteristics are that when the number of upward spins is 0, 2, or 4, the four-body interaction terms have the same value, which is referred to as a first value, while when the number of upward spins is 1 or 3, the four-body interaction terms have the same value, which is referred to as a second value different from the first value. That is, it is necessary to have the same first value when the number of upward spins is even, and have the same second value when the number of upward spins is odd. Depending on the circuit to be designed, the terms indicating the interaction between less than four bodies and terms indicating the interaction between five or more bodies may be be generated. However, the constraint requested by the LHZ scheme requires that only four-body interaction terms with the characteristics described above be present. Thus, if a circuit in which only four-body interaction terms having the above-described characteristics are present can be designed, the four-body interaction for the LHZ scheme can be implemented. Hereinafter, a circuit that implements the four-body interaction while reducing the number of qubit circuits as compared with the circuit described in Non Patent Literature 2 will be described.

First Example Embodiment

Figure 1:
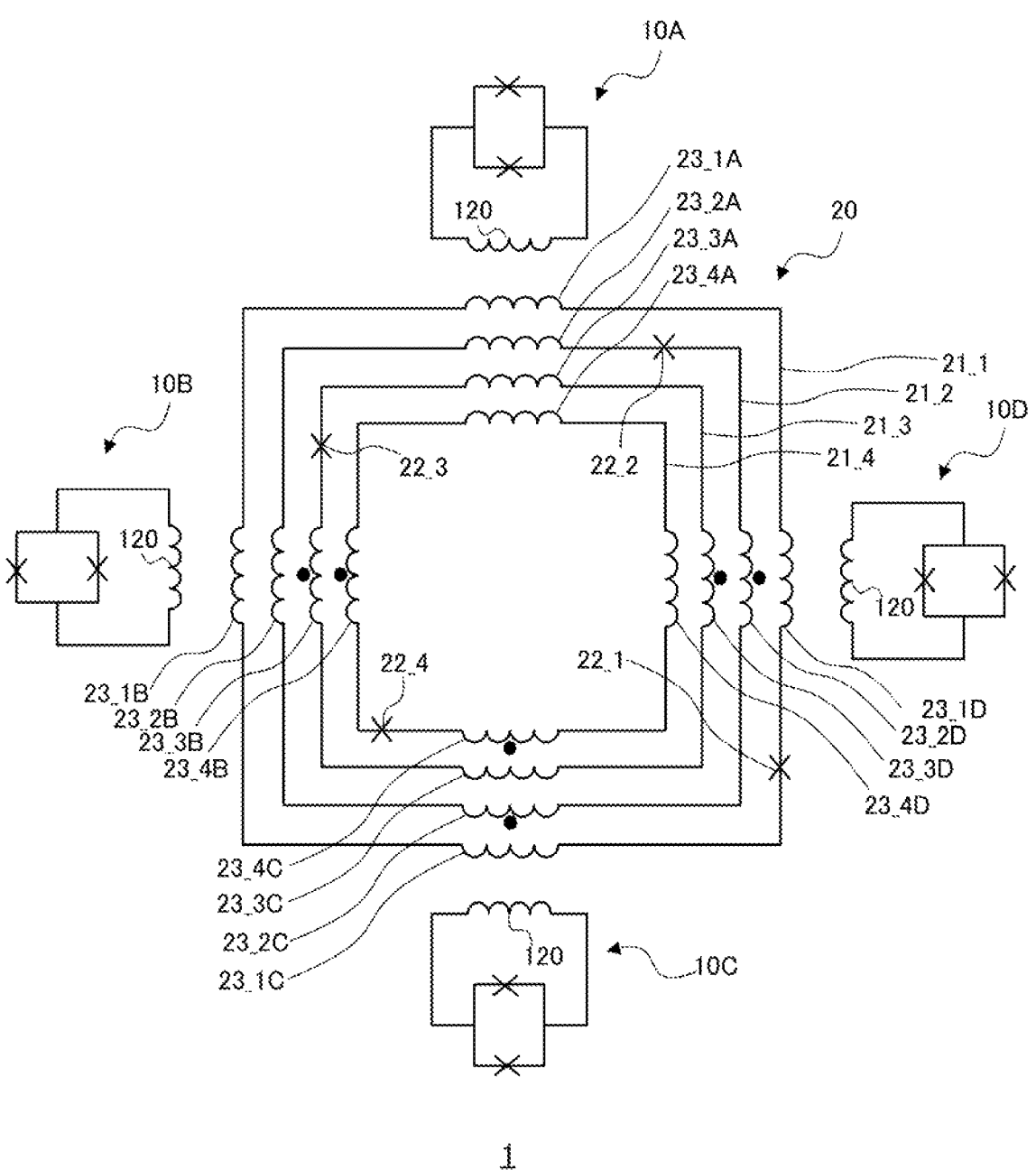
FIG. 1 is a schematic diagram showing a configuration of a superconducting circuit according to a first example embodiment.

FIG. 1 is a schematic diagram showing a configuration of a superconducting circuit 1 according to a first example embodiment. As shown in FIG. 1, the superconducting circuit 1 has four superconducting qubit circuits 10A, 10B, 10C, and 10D, and one coupling circuit 20 inductively coupled to four the superconducting qubit circuits 10A, 10B,

10C, and 10D. In the following description, the superconducting qubit circuits 10A, 10B, 10C, and 10D are referred to as superconducting qubit circuits 10 when they are referred to without any particular distinction between them.

All of the four superconducting qubit circuits 10 have the same configuration. Each of the superconducting qubit circuits 10 can be in either a first phase state or a second phase state. Each of the superconducting qubit circuits 10 indicates a qubit by being in the first phase state or the second phase state. Here, the first phase state corresponds to an upward spin and the second phase state corresponds to a downward spin. In this example embodiment, a phase in the first phase state and a phase in the second phase state have the same absolute value but have signs opposite to each other. However, the absolute value of the phase in the first state may not be completely the same as the absolute value of the phase in the second state, and there may be a difference of about ±10% between these phases. In this example embodiment, the superconducting qubit circuits 10 are specifically DC magnetic flux parametrons.

Figure 2:
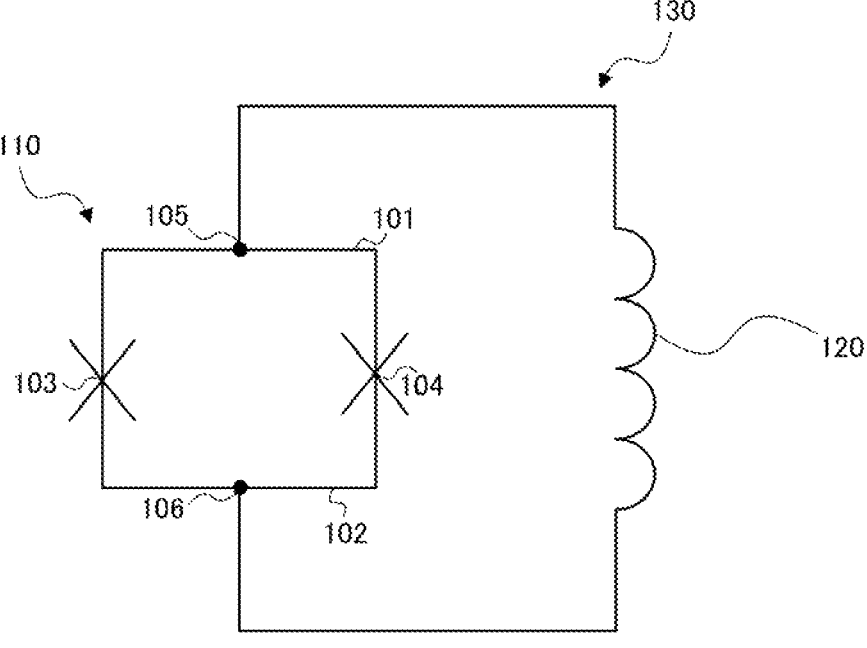
FIG. 2 is a schematic diagram showing a configuration of a superconducting qubit circuit.

As shown in FIG. 2, the DC magnetic flux parametron which is the superconducting qubit circuit 10 includes a loop circuit 110 and an inductor 120. The loop circuit 110 includes a first superconducting line 101 for connecting a first Josephson junction 103 to a second Josephson junction 104, and a second superconducting line 102 for connecting the first Josephson junction 103 to the second Josephson junction 104. In other words, each of the superconducting qubit circuits 10 includes the loop circuit 110 in which the first superconducting line 101 and the second superconducting line 102 are connected by the first Josephson junction 103 and the second Josephson junction 104, and the inductor 120. As shown in FIG. 2, the first superconducting line 101, the first Josephson junction 103, the second superconducting line 102, and the second Josephson junction 104 are connected in a ring shape (i.e., in a circular fashion), thereby forming the loop circuit 110. In other words, in the loop circuit 110, the first and second superconducting lines 101 and 102 are joined by the first and second Josephson junctions 103 and 104, thereby forming a loop. That is, it can also be said that the loop circuit 110 is a DC-SQUID (Superconducting QUantum Interference Device).

The loop circuit 110 is shunted by the inductor 120. That is, a first part 105 of the first superconducting line 101 and a second part 106 of the second superconducting line 102 are shunted by the inductor 120. In other words, in each of the superconducting qubit circuits 10, input/output ends of the DC-SQUID are shunted by the inductor 120. That is, it can be said that, by connecting the inductor 120 and the loop circuit 110 in a ring shape, a loop circuit 130 in which the loop circuit 110 is incorporated on the line of the loop is formed. Here, the first part 105 is any part of the first superconducting line 101. That is, a position of the first part 105 in the first superconducting line 101 is not particularly limited. Similarly, the second part 106 is any part of the second superconducting line 102. That is, the position of the second part 106 in the second superconducting line 102 is not particularly limited. The inductor 120 is present as a non-floating component, and may be mounted, for example, as meander wiring or a coil, but the mounting method is not limited to this.

The DC flux parametron may be in two states of a flux in the loop circuit 130. These two states correspond to the two phase states described above, respectively. That is, the state of each magnetic flux corresponds to 0 and 1 of the qubits.

The coupling circuit 20 includes four loop circuits each including an inductor and Josephson junctions. Specifically, the coupling circuit 20 includes a loop circuit 21_1, a loop circuit 21_2, a loop circuit 21_3, and a loop circuit 21_4. In the following description, when the loop circuits 21_1, 21_2, 21_3, and 21_4 are referred to without any particular distinction between them, they are referred to as loop circuits 21. Josephson junctions 22_1, 22_2, 22_3, and 22_4, which will be described later, of the respective loop circuits 21 are referred to as the Josephson junctions 22 when they are referred to without any particular distinction between them.

Figure 3:
FIG. 3 is a schematic diagram showing a configuration of a reverse direction inductor.

Each of the loop circuits 21 has one Josephson junction 22_1, 22_2, 22_3 or 22_4 at any position of the loop. The inductor included in each of the loop circuits 21 is inductively coupled to one of the superconducting qubit circuits 10. The types of the inductor can be classified into the following two types. A first type of the inductor is an inductor inserted in the loop circuit 21 so that a current flows in the same direction as the current direction of the loop circuit 21. This inductor is referred to as a positive direction inductor. As shown in FIG. 3, a second type of the inductor is an inductor formed of twisted wiring and is inserted into the loop circuit 21 so that a current flows in a direction opposite to the current direction of the loop circuit 21. This inductor is referred to as a reverse direction inductor. In FIG. 1, the reverse direction inductor is indicated by a circuit symbol of the positive direction inductor with an additional black circle. The positive direction inductor and the reverse direction inductor of the loop circuit 21 are both inductors present as non-floating components, and may be mounted as, for example, meander wiring or a coil but the mounting method is not limited thereto.

Specifically, the loop circuit 21_1 has the Josephson junction 22_1, a positive direction inductor 23_1A, a positive direction inductor 23_1B, a positive direction inductor 23_1C, and a positive direction inductor 23_1D. Here, the positive direction inductor 23_1A is inductively coupled to the superconducting qubit circuit 10A. The positive direction inductor 23_1B is inductively coupled to the superconducting qubit circuit 10B. The positive direction inductor 23_1C is inductively coupled to the superconducting qubit circuit 10C. The positive direction inductor 23_1D is inductively coupled to the superconducting qubit circuit 10D.

The loop circuit 21_2 has the Josephson junction 22_2, a positive direction inductor 23_2A, a positive direction inductor 23_2B, a reverse direction inductor 23_2C, and a reverse direction inductor 23_2D. Here, the positive direction inductor 23_2A is inductively coupled to the superconducting qubit circuit 10A. The positive direction inductor 23_2B is inductively coupled to the superconducting qubit circuit 10B. The reverse direction inductor 23_2C is inductively coupled to the superconducting qubit circuit 10C. The reverse direction inductor 23_2D is inductively coupled to the superconducting qubit circuit 10D.

The loop circuit 21_3 has the Josephson junction 22_3, a positive direction inductor 23_3A, a reverse direction inductor 23_3B, a positive direction inductor 23_3C, and a reverse direction inductor 23_3D. Here, the positive direction inductor 23_3A is inductively coupled to the superconducting qubit circuit 10A. The reverse direction inductor 23_3B is inductively coupled to the superconducting qubit circuit 10B. The positive direction inductor 23_3C is inductively coupled to the superconducting qubit circuit 10C. The reverse direction inductor 23_3D is inductively coupled to the superconducting qubit circuit 10D.

The loop circuit 21_4 has the Josephson junction 22_4, a positive direction inductor 23_4A, a reverse direction inductor 23_4B, a reverse direction inductor 23_4C, and a positive direction inductor 23_4D. Here, the positive direction inductor 23_4A is inductively coupled to the superconducting qubit circuit 10A. The reverse direction inductor 23_4B is inductively coupled to the superconducting qubit circuit 10B. The reverse direction inductor 23_4C is inductively coupled to the superconducting qubit circuit 10C. The positive direction inductor 23_4D is inductively coupled to the superconducting qubit circuit 10D.

That is, the loop circuits 21_1, 21_2, 21_3, and 21_4 are inductively coupled to the inductor 120 of the superconducting qubit circuit 10A by the positive direction inductors 23_1A, 23_2A, 23_3A, and 23_4A, respectively. The loop circuits 21_1 and 21_2 are inductively coupled to the inductor 120 of the superconducting qubit circuit 10B by the positive direction inductors 23_1B and 23_2B, respectively, and the loop circuits 21_3 and 21_4 are inductively coupled to the inductor 120 of the superconducting qubit circuit 10B by the reverse direction inductors 23_3B and 23_4B, respectively. The loop circuits 21_1 and 21_3 are inductively coupled to the inductor 120 of the superconducting qubit circuit 10C by the positive direction inductors 23_1C and 23_3C, respectively, and the loop circuits 21_2 and 21_4 are inductively coupled to the inductor 120 of the superconducting qubit circuit 10C by the reverse direction inductors 23_2C and 23_4C, respectively. The loop circuits 21_1 and 21_4 are inductively coupled to the inductor 120 of the superconducting qubit circuit 10D by the positive direction inductors 23_1D and 23_4D, respectively, and the loop circuits 21_2 and 21_3 are inductively coupled to the inductor 120 of the superconducting qubit circuit 10D by the reverse direction inductors 23_2D and 23_3D, respectively.

As described above, in the superconducting circuit 1, the combination of the types of inductors used for the inductive coupling between the one superconducting qubit circuit 10 and the four loop circuits 21 differs for each superconducting qubit circuit 10.

As described above, in each loop circuit 21, the Josephson junction 22 may be located at any position on the loop. However, as shown in FIG. 1, by arranging the four Josephson junctions 22 regularly, the area of the chip on which the circuits are mounted can be effectively used, and there is an additional effect that the circuit area of the coupling circuit 20 can be made smaller. Here, for the purpose of explanation, two superconducting qubit circuits 10 of interest among the four superconducting qubit circuits 10 are referred to as qubit circuits X and Y, respectively. The arrangement of the Josephson junctions 22 preferably has the following rule. When the Josephson junction 22 of a certain one of the loop circuits 21 is arranged between two adjacent inductors 23, which are composed of the inductor 23 inductively coupled to the qubit circuit X and the inductor 23 inductively coupled to the qubit circuit Y, the rule is such that the following conditions are satisfied. That is, in this above case, the following conditions are satisfied in regard to all of the remaining three loop circuits 21 other than the corresponding loop circuit 21. The Josephson junctions 22 of the three remaining loop circuits 21 are arranged so as not to be arranged between two adjacent inductors 23, which are composed of the inductor 23 inductively coupled to the qubit circuit X and the inductor 23 inductively coupled to the qubit circuit Y.

In other words, the Josephson junction 22 is preferably arranged as follows. In the i-th loop circuit 21, in which i is any integer from 1 to 4, of the four loop circuits 21, the Josephson junction 22 is provided at the following position. That is, the Josephson junction 22 is provided between the two adjacent inductors 23, which are composed of the inductor 23 inductively coupled to the j-th circuit of the four superconducting qubit circuits 10 and the inductor 23 inductively coupled to the k-th circuit of the four superconducting qubit circuits 10. Here, j and k are integers from 1 to 4, and the values of k and j are different. The Josephson junction 22 is provided at the following position in each of the loop circuits 21 other than the i-th circuit of the four loop circuits 21. That is, the Josephson junction 22 is provided at a position other than between two adjacent inductors 23, which are composed of the inductor 23 inductively coupled to the j-th circuit and the inductor 23 inductively coupled to the k-th circuit among the four superconducting qubit circuits 10.

In this example embodiment, all inductances of the inductors of the loop circuits 21 described above are set to the same value. That is, all of the inductors 23_1A to 23_1D, 23_2A to 23_2D, 23_3A to 23_3D, and 23_4A to 23_4D have the same inductance. However, these inductances need not be completely the same, and manufacturing variations of about ±10% are acceptable. All the inductors 120 of the four superconducting qubit circuits 10 have the same inductance. However, also in this case, the inductance is allowed to vary by about ±10%.

Each superconducting qubit circuit 10 is inductively coupled to each of the four loop circuits 21 constituting the coupling circuit 20 by a mutual inductance having the same absolute value. That is, for example, when the mutual inductance between the superconducting qubit circuit 10A and the loop circuit 21_1 is M, the mutual inductance between the superconducting qubit circuit 10A and the loop circuit 21_2 is also M. Likewise, the mutual inductance between the superconducting qubit circuit 10A and the loop circuit 21_3 and between the superconducting qubit circuit 10A and the loop circuit 21_4 is also M.

On the other hand, the mutual inductances between the superconducting qubit circuit 10B and the loop circuit 21_1 and between the superconducting qubit circuit 10B and the loop circuit 21_2 are M. The mutual inductances between the superconducting qubit circuit 10B and the loop circuit 21_3 and between the superconducting qubit circuit 10B and the loop circuit 21_4 are–M.

The mutual inductance between the superconducting qubit circuit 10C and the loop circuit 21_1 is M. The mutual inductance between the superconducting qubit circuit 10C and the loop circuit 21_2 is–M. The mutual inductance between the superconducting qubit circuit 10C and the loop circuit 21_3 is M.

The mutual inductance between the superconducting qubit circuit 10C and the loop circuit 21_4 is–M. The mutual inductance between the superconducting qubit circuit 10D and the loop circuit 21_1 is M. The mutual inductances between the superconducting qubit circuit 10D and the loop circuit 21_2 and between the superconducting qubit circuit 10D and the loop circuit 21_3 are–M. The mutual inductance between the superconducting qubit circuit 10D and the loop circuit 21_4 is M.

As described above, in the case of coupling by the reverse direction inductor, the sign of the mutual inductance is opposite to that in the case of coupling by the positive direction inductor. For the mutual inductance M, manufacturing variations of about ±10% are acceptable. Note that being inductively coupled can be expressed as being magnetically coupled.

In this example embodiment, the critical current values of all the Josephson junctions 22 of the respective loop circuits 21 are the same. However, these critical current values need not be completely the same, and manufacturing variations of about ±10% are acceptable.

The interaction term of the Hamiltonian of the superconducting circuit 1 shown in FIG. 1 is only the term of the four-body interaction shown by the following Formula (1).

$$[\text{Interaction term}] = E_J \cos[M(\varphi_1 + \varphi_2 + \varphi_3 + \varphi_4)] + E_J \cos[M(\varphi_1 + \varphi_2 - \varphi_3 - \varphi_4)] + E_J \cos[M(\varphi_1 - \varphi_2 + \varphi_3 - \varphi_4)] + E_J \cos[M(\varphi_1 - \varphi_2 - \varphi_3 + \varphi_4)] \dots \quad (1)$$

In Formula (1), $\varphi_1$ is a phase of the superconducting qubit circuit 10A, $\varphi_2$ is a phase of the superconducting qubit circuit 10B, $\varphi_3$ is a phase of the superconducting qubit circuit 10C, and $\varphi_4$ is a phase of the superconducting qubit circuit 10D. M is the mutual inductance of the superconducting qubit circuit 10 and the loop circuit 21. $E_J$ is Josephson energy of the Josephson junction 22, and is expressed by Formula (2) below. In Formula (2), $\Phi_0$ indicates a magnetic flux quantum (about $2.07 \times 10^{-15}$ Wb), and $I_C$ indicates a critical current value of the Josephson junction 22.

$$E_J = \Phi_0 I_C / 2\pi \dots \quad (2)$$

The phase of each superconducting qubit circuit 10 takes a value of $+\varphi_0$ if the superconducting qubit circuit 10 is an upward spin, i.e., in the first phase state, and a value of $-\varphi_0$ if the superconducting qubit circuit 10 is a downward spin, i.e., in the second phase state. Therefore, there are 16 combinations of $(\varphi_1, \varphi_2, \varphi_3, \varphi_4)$, which is 2 to the power of 4. Among the 16 combinations, there are eight combinations in which the number of upward spins is zero, two, or four. In this example embodiment, in any of these eight combinations, the above interaction term has the same value, which is the first value, as $E_J(3 + \cos[4M\varphi_0])$. On the other hand, there are a total of eight combinations in which the number of upward spins is one or three. In this example embodiment, in any of these eight combinations, the above interaction term has the same value, which is the second value, as $4E_{Jcos}[2M\varphi_0]$. In other words, when the number of superconducting qubit circuits 10 to be in the first phase state among the four superconducting qubit circuits 10 is an even number, the interaction term of the Hamiltonian of the superconducting circuit 1 takes the first value. When the number of superconducting qubit circuits 10 to be the first phase state among the four superconducting qubit circuits 10 is an odd number, the interaction term of the Hamiltonian of the superconducting circuit 1 takes the second value.

As described above, in this example embodiment, circuits satisfying the four-body interaction, which is a constraint required by the LHZ scheme, is implemented without using any other superconducting qubit circuit than the four superconducting qubit circuits 10. That is, while the four-body interaction is implemented by eight superconducting qubit circuits in Non Patent Literature 2, the four-body interaction is implemented by four superconducting qubit circuits in this example embodiment, meaning that the number of qubit circuits can be reduced to half.

Note that FIG. 1 merely schematically shows the configuration of the superconducting circuit 1, and the arrangement and shape of the circuits and elements included in the superconducting circuit 1 are not limited to the example embodiment shown in FIG. 1. For example, the shape of the loop circuit 21 may not be rectangular. Even if the shape of the loop circuit 21 is rectangular, the superconducting qubit circuit 10 may not be disposed near the center of each side of the rectangular loop circuit 21. For example, the superconducting qubit circuit 10 may be disposed near each vertex of the rectangular loop circuit 21. Further, for example, in the schematic diagram of FIG. 1, the four loop circuits 21 are arranged on a two-dimensional plane so that the center axes thereof are the same and the distances from the center axes thereof are different from each other. Alternatively, the four loop circuits 21 may be arranged so that the center axes thereof are the same and the distances from the center axes thereof are the same in a three-dimensional space. That is, the four loop circuits 21 may be mounted in a stacked structure. In FIG. 1, the superconducting qubit circuits 10 are arranged outside the loop circuit 21, and instead may be disposed, for example, right above, right below, or inside the loop circuit 21.

Second Example Embodiment

Next, a second example embodiment will be described. A pattern of the combinations of the positive direction inductors and the reverse direction inductors included in each loop circuit 21 according to the second example embodiment differs from that according to the first example embodiment. In addition, since the second example embodiment is the same as the first example embodiment except for the above, repeated descriptions will be omitted as appropriate.

Figure 4:
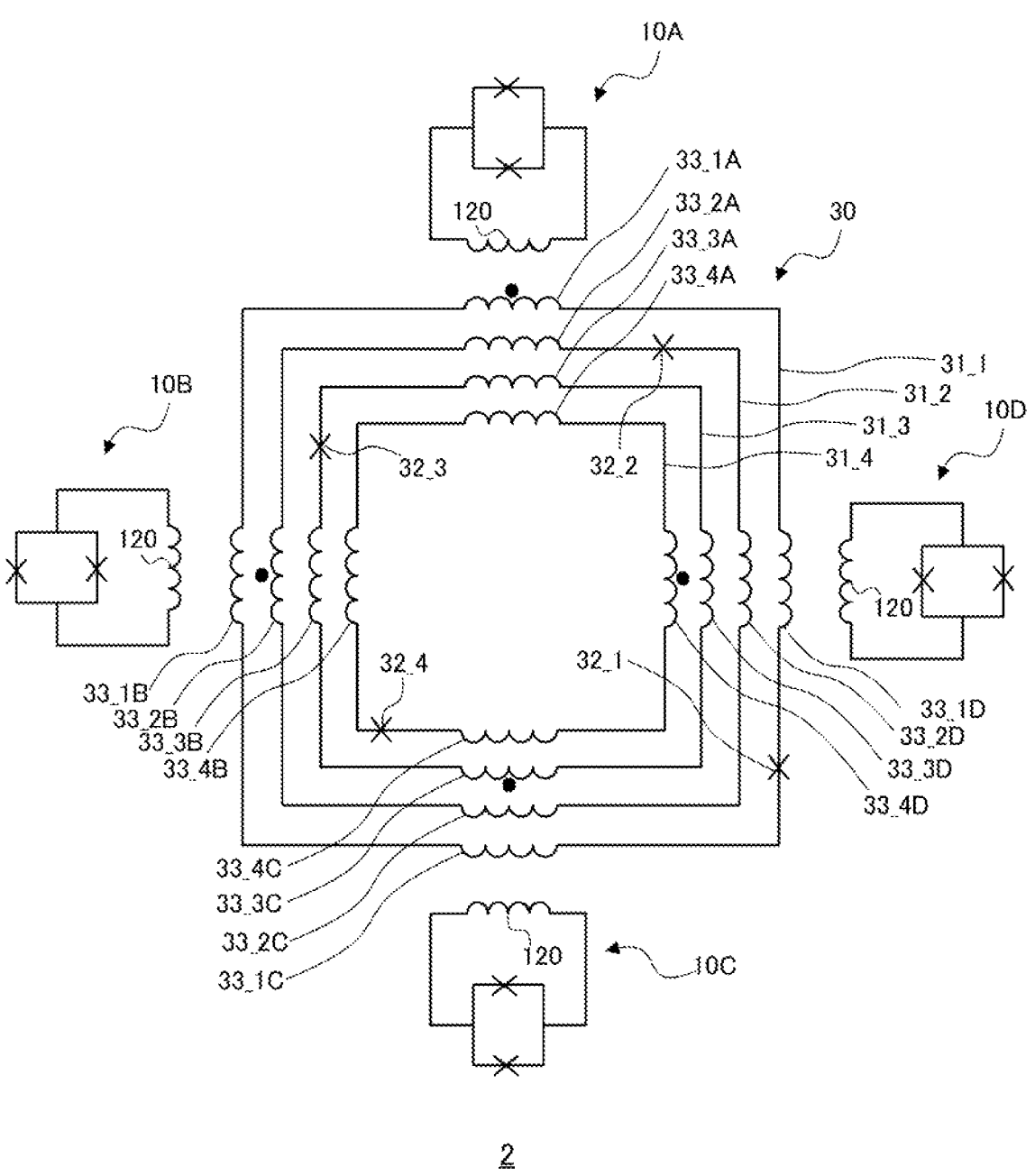
FIG. 4 is a schematic diagram showing a configuration of a superconducting circuit according to a second example embodiment.

FIG. 4 is a schematic diagram showing a configuration of a superconducting circuit 2 according to the second example embodiment. As shown in FIG. 4, the superconducting circuit 2 has four superconducting qubit circuits 10 and one coupling circuit 30 inductively coupled to the four superconducting qubit circuits 10.

As in the first example embodiment, the coupling circuit 30 includes four loop circuits each including an inductor and Josephson junctions. Specifically, the coupling circuit 30 includes a loop circuit 31_1, a loop circuit 31_2, a loop circuit 31_3, and a loop circuit 31_4. In the following description, when the loop circuits 31_1, 31_2, 31_3, and 31_4 are referred to without any particular distinction between them, they are referred to as loop circuits 31. Josephson junctions 32_1, 32_2, 32_3, and 32_4, which will be described later, of the respective loop circuits 31 are referred to as the Josephson junctions 32 when they are referred to without any particular distinction between them.

The loop circuit 31 has one Josephson junction 32_1, 32_2, 32_3 or 32_4 at any position of the loop. The inductor included in each of the loop circuits 31 is a positive direction inductor or a reverse direction inductor, and are inductively coupled to one of the superconducting qubit circuits 10. The positive direction inductor and the reverse direction inductor of the loop circuit 31 are both inductors present as nonfloating components, and may be mounted as, for example, meander wiring or a coil but the mounting method is not limited thereto.

Specifically, the loop circuit 31_1 has the Josephson junction 32_1, a reverse direction inductor 33_1A, a positive direction inductor 33_1B, a positive direction inductor 33_1C, and a positive direction inductor 33_1D. Here, the reverse direction inductor 33_1A is inductively coupled to the superconducting qubit circuit 10A. The positive direction inductor 33_1B is inductively coupled to the superconducting qubit circuit 10B. The positive direction inductor 33_1C is inductively coupled to the superconducting qubit circuit 10C. The positive direction inductor 33_1D is inductively coupled to the superconducting qubit circuit 10D.

The loop circuit 31_2 has the Josephson junction 32_2, a positive direction inductor 33_2A, a reverse direction inductor 33_2B, a positive direction inductor 33_2C, and a positive direction inductor 33_2D. Here, the positive direction inductor 33_2A is inductively coupled to the superconducting qubit circuit 10A. The reverse direction inductor 33_2B is inductively coupled to the superconducting qubit circuit 10B. The positive direction inductor 33_2C is inductively coupled to the superconducting qubit circuit 10C. The positive direction inductor 33_2D is inductively coupled to the superconducting qubit circuit 10D.

The loop circuit 31_3 has the Josephson junction 32_3, a positive direction inductor 33_3A, a positive direction inductor 33_3B, a reverse direction inductor 33_3C, and a positive direction inductor 33_3D. Here, the positive direction inductor 33_3A is inductively coupled to the superconducting qubit circuit 10A. The positive direction inductor 33_3B is inductively coupled to the superconducting qubit circuit 10B. The reverse direction inductor 33_3C is inductively coupled to the superconducting qubit circuit 10C. The positive direction inductor 33_3D is inductively coupled to the superconducting qubit circuit 10D.

The loop circuit 31_4 has the Josephson junction 32_4, a positive direction inductor 33_4A, a positive direction inductor 33_4B, a positive direction inductor 33_4C, and a reverse direction inductor 33_4D. Here, the positive direction inductor 33_4A is inductively coupled to the superconducting qubit circuit 10A. The positive direction inductor 33_4B is inductively coupled to the superconducting qubit circuit 10B. The positive direction inductor 33_4C is inductively coupled to the superconducting qubit circuit 10C. The reverse direction inductor 33_4D is inductively coupled to the superconducting qubit circuit 10D.

That is, the loop circuits 31_2, 31_3, and 31_4 are inductively coupled to the inductor 120 of the superconducting qubit circuit 10A by the positive direction inductors 33_2A, 33_3A, and 33_4A, respectively, and the loop circuit 31_1 is inductively coupled to the inductor 120 of the superconducting qubit circuit 10A by the reverse direction inductor 33_1A. The loop circuits 31_1, 31_3, and 31_4 are inductively coupled to the inductor 120 of the superconducting qubit circuit 10B by the positive direction inductors 33_1B, 33_3B, and 33_4B, respectively, and the loop circuit 31_2 is inductively coupled to the inductor 120 of the superconducting qubit circuit 10B by the reverse direction inductor 33_2B. The loop circuits 31_1, 31_2, and 31_4 are inductively coupled to the inductor 120 of the superconducting qubit circuit 10C by the positive direction inductors 33_1C, 33_2C, and 33_4C, respectively, and the loop circuit 31_3 is inductively coupled to the inductor 120 of the superconducting qubit circuit 10C by the reverse direction inductor 33_3C. The loop circuits 31_1, 31_2, and 31_3 are inductively coupled to the inductor 120 of the superconducting qubit circuit 10D by the positive direction inductors 33_1D, 33_2D, and 33_3D, respectively, and the loop circuit 31_4 is inductively coupled to the inductor 120 of the superconducting qubit circuit 10D by the reverse direction inductor 33_4D.

As described above, in the superconducting circuit 2, the combination of the types of inductors used for the inductive coupling between the one superconducting qubit circuit 10 and the four loop circuits 31 differs for each superconducting qubit circuit 10.

As described above, in each loop circuit 31, the Josephson junction 32 may be located at any position on the loop. However, as shown in FIG. 4, by arranging the four Josephson junctions 32 regularly, the area of the chip on which the circuits are mounted can be effectively used, and there is an additional effect that the circuit area of the coupling circuit 30 can be made smaller. Here, for the purpose of explanation, two superconducting qubit circuits 10 of interest among the four superconducting qubit circuits 10 are referred to as qubit circuits X and Y, respectively. The arrangement of the Josephson junctions 32 preferably has the following rule. When the Josephson junction 32 of a certain one of the loop circuits 31 is arranged between two adjacent inductors 33, which are composed of the inductor 33 inductively coupled to the qubit circuit X and the inductor 33 inductively coupled to the qubit circuit Y, the rule is such that the following conditions are satisfied. That is, in this above case, the following conditions are satisfied in regard to all of the remaining three loop circuits 31 other than the corresponding loop circuit 31. The Josephson junctions 32 of the three remaining loop circuits 31 are arranged so as not to be arranged between two adjacent inductors 33, which are composed of the inductor 33 inductively coupled to the qubit circuit X and the inductor 33 inductively coupled to the qubit circuit Y.

In other words, the Josephson junction 32 is preferably arranged as follows. In the i-th loop circuit 31, in which i is any integer from 1 to 4, of the four loop circuits 31, the Josephson junction 32 is provided at the following position. That is, the Josephson junction 32 is provided between the two adjacent inductors 33, which are composed of the inductor 33 inductively coupled to the j-th circuit of the four superconducting qubit circuits 10 and the inductor 33 inductively coupled to the k-th circuit of the four superconducting qubit circuits 10. Here, j and k are integers from 1 to 4, and the values of k and j are different. The Josephson junction 32 is provided at the following position in each of the loop circuits 31 other than the i-th circuit of the four loop circuits 31. That is, the Josephson junction 32 is provided at a position other than between two adjacent inductors 33, which are composed of the inductor 33 inductively coupled to the j-th circuit and the inductor 33 inductively coupled to the k-th circuit among the four superconducting qubit circuits 10.

The condition of the inductance of the inductor of each loop circuit 31 and the condition of the inductance of the inductor of the superconducting qubit circuit 10 are the same as those of the first example embodiment. Therefore, each superconducting qubit circuit 10 is inductively coupled to all of the four loop circuits 31 constituting the coupling circuit 30 with the same coupling strength. The condition of the critical current value of the Josephson junction 32 of each loop circuit 31 is also the same as that of the first example embodiment.

The interaction term of the Hamiltonian of the superconducting circuit 2 shown in FIG. 4 is only the term of the four-body interaction shown by the following Formula (3).

$$[\text{Interaction term}] = E_J \cos[M(\varphi_1 + \varphi_2 + \varphi_3 - \varphi_4)] + E_J \cos[M(\varphi_1 + \varphi_2 - \varphi_3 + \varphi_4)] + E_J \cos[M(\varphi_1 - \varphi_2 + \varphi_3 + \varphi_4)] + E_J \cos[M(-\varphi_1 + \varphi_2 + \varphi_3 + \varphi_4)] \ldots \quad (3)$$

In Formula (3), $\varphi_1$ is a phase of the superconducting qubit circuit 10A, $\varphi_2$ is a phase of the superconducting qubit circuit 10B, $\varphi_3$ is a phase of the superconducting qubit circuit 10C, and $\varphi_4$ is a phase of the superconducting qubit circuit 10D. M is the mutual inductance of the superconducting qubit circuit 10 and the loop circuit 31. $E_J$ is Josephson energy of the Josephson junction 32.

In a manner similar to the first example embodiment, there are 16 combinations of $(\varphi_1, \varphi_2, \varphi_3, \varphi_4)$. Among the 16 combinations, there are eight combinations in which the number of upward spins is zero, two, or four. In this example embodiment, in any of these eight combinations, the above interaction term has the same value, which is the first value, as $4E_J \cos[2M\varphi_0]$. On the other hand, there are a total of eight combinations in which the number of upward spins is one or three. In this example embodiment, in any of these eight combinations, the above interaction term has the same value, which is the second value, as $E_J(3 + \cos[4M\varphi_0])$. In other words, when the number of superconducting qubit circuits 10 to be in the first phase state among the four superconducting qubit circuits 10 is an even number, the interaction term of the Hamiltonian of the superconducting circuit 1 takes the first value. When the number of superconducting qubit circuits 10 to be the first phase state among the four superconducting qubit circuits 10 is an odd number, the interaction term of the Hamiltonian of the superconducting circuit 1 takes the second value.

As described above, also in this example embodiment, circuits satisfying the four-body interaction, which is a constraint required by the LHZ scheme, is implemented without using any other superconducting qubit circuit than the four superconducting qubit circuits 10. That is, while the four-body interaction is implemented by eight superconducting qubit circuits in Non Patent Literature 2, the four-body interaction is implemented by four superconducting qubit circuits in this example embodiment, meaning that the number of qubit circuits can be reduced to half.

Note that FIG. 4 merely schematically shows the configuration of the superconducting circuit 2, and the arrangement and shape of the circuits and elements included in the superconducting circuit 2 are not limited to the example embodiment shown in FIG. 4, in a manner similar to the first example embodiment.

The superconducting circuits shown in the first and second example embodiments can also be expressed as follows. The superconducting circuit has a plurality of superconducting qubit circuits 10 and the coupling circuit 20 or 30 inductively coupled to the plurality of superconducting qubit circuits 10. The coupling circuit 20 or 30 includes the plurality of loop circuits 21 or 31 having the inductors 23 or 33 and the Josephson junctions 22 or 32. The type of the inductor 23 or 33 is a positive direction inductor or a reverse direction inductor. Furthermore, the combination of the types of inductors 23 or 33 used in the inductive coupling between one superconducting qubit circuit 10 and the plurality of loop circuits 21 or 31 differs for each superconducting qubit circuit 10.

Third Example Embodiment

Next, an example embodiment of a quantum computer composed of the superconducting qubit circuit 10 which is a DC magnetic flux parametron and the coupling circuit 20 or 30 shown in the first or second example embodiment will be described. The quantum computer is a quantum annealing computer that calculates a solution of any problem that can be mapped to the Ising model. As mentioned above, in the DC flux parametron, a state of a magnetic flux in the loop circuit 130 may be either a first state or a second state. These two kinds of states correspond to the first phase state and the second phase state of the qubit, respectively. These two kinds of states correspond to 0 and 1 of the qubits, respectively.

Figure 5:
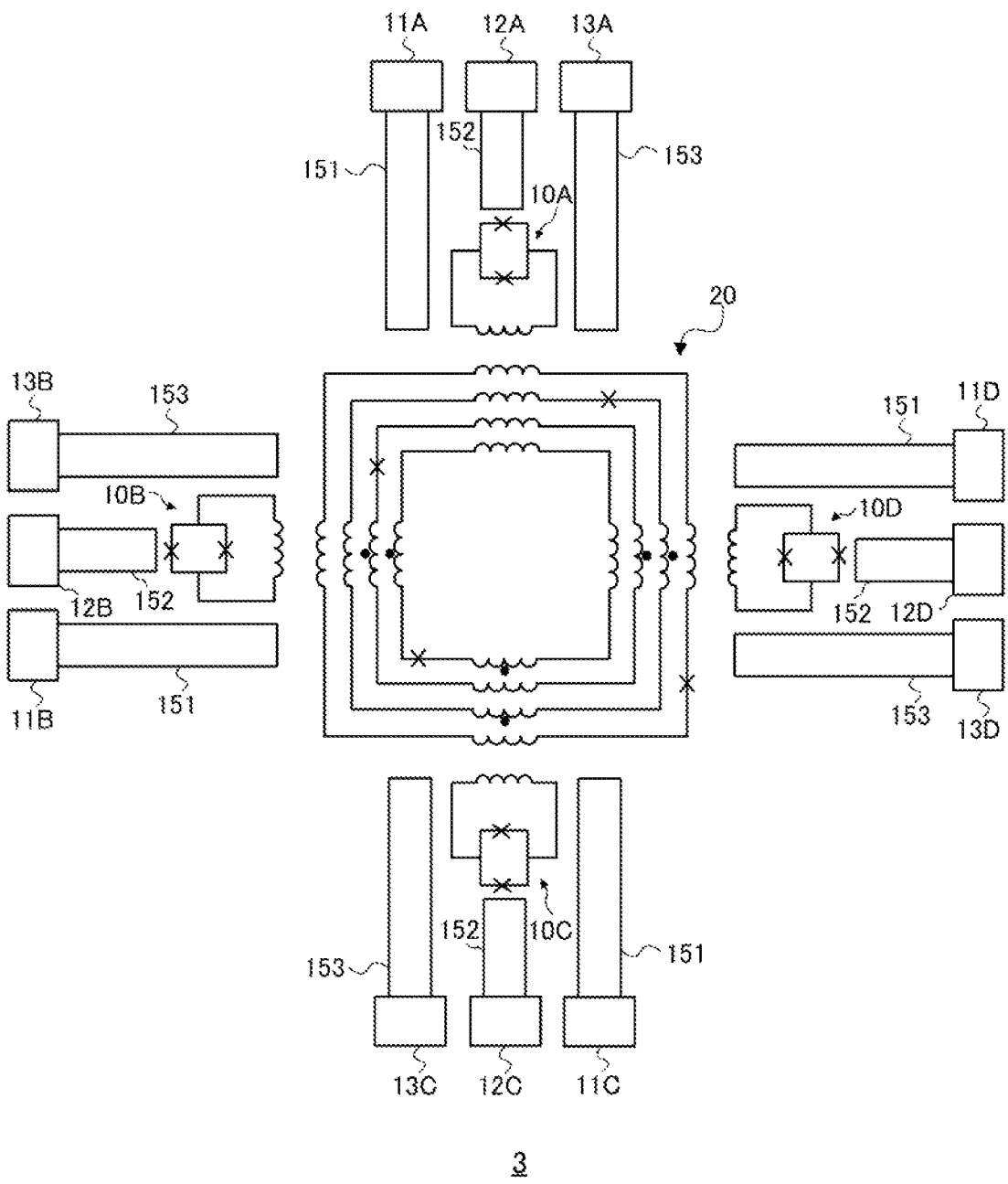
FIG. 5 is a schematic diagram showing a configuration of a quantum computer using the superconducting qubit circuit and a coupling circuit shown in the first example embodiment.

FIG. 5 is a schematic diagram showing a configuration of a quantum computer 3 using the superconducting qubit circuits 10 and the coupling circuit 20 shown in the first example embodiment. In the quantum computer 3 shown in FIG. 5, four superconducting qubit circuits 10, which are DC flux parametrons, are connected by one coupling circuit 20.

The quantum computer 3 is a computer in which the superconducting qubit circuits 10 are coupled by the LHZ scheme.

A first control unit 11A, a second control unit 12A, and a reading unit 13A are coupled to a superconducting qubit circuit 10A. Similarly, a first control unit 11B, a second control unit 12B, and a reading unit 13B are coupled to a superconducting qubit circuit 10B. A first control unit 11C, a second control unit 12C, and a reading unit 13C are coupled to a superconducting qubit circuit 10C. A first control unit 11D, a second control unit 12D, and a reading unit 13D are coupled to a superconducting qubit circuit 10D. In the following description, when the first control units 11A, 11B, 11C, and 11D are referred to without any particular distinction between them, they are referred to as the first control units 11. When the second control units 12A, 12B, 12C, and 12D are referred to without any particular distinction between them, they are referred to as the second control units 12. When the reading units 13A, 13B, 13C, and 13D are referred to without any particular distinction between them, they are referred to as the reading units 13.

A loop circuit 151 which is a loop-shaped circuit (a current path) is connected to the first control unit 11, and the loop circuit 151 is magnetically coupled to the loop circuit 130 of the superconducting qubit circuit 10. The first control unit 11 is a circuit that controls a DC current of a predetermined current value to flow in the loop circuit 151. When the first control unit 11 controls a DC current to flow in the loop circuit 151, the loop circuit 151 generates a magnetic field, and the magnetic field is applied to the loop circuit 130 of the superconducting qubit circuit 10.

A loop circuit 152 which is a loop-shaped circuit (a current path) is connected also to the second control unit 12, and the loop circuit 152 is magnetically coupled to the loop circuit 110 of the superconducting qubit circuit 10. The second control unit 12 is a circuit that controls a DC current of a predetermined current value to flow in the loop circuit 152. When the second control unit 12 controls a DC current to flow in the loop circuit 152, the loop circuit 152 generates a magnetic field, and the magnetic field is applied to the loop circuit 110 of the superconducting qubit circuit 10.

The first control units 11 and the second control units 12 drive the superconducting qubit circuits 10 as follows.

Each of the superconducting qubit circuits 10 functions as a two-level system. That is, each of the superconducting qubit circuits 10 has two distinct states, a first phase state and a second phase state. The superconducting qubit circuit 10 can be in the first phase state, the second phase state, or a quantum superposition state in which the first and second phase states are superposed. The relationship between the magnitude of the energy of the first phase state and that of the energy of the second phase state can be controlled by the magnitude of the DC current flowing from the first control unit 11 to the loop circuit 151. The state of the superconducting qubit circuit 10 can be quantum mechanically tunneled between the first phase state and the second phase state. The frequency of this tunneling varies according to the height of the energy barrier between the first and second phase states. That is, the lower the barrier, the higher the frequency of tunneling becomes, and the higher the barrier, the lower the frequency of tunneling becomes. The height of the energy barrier can be controlled by the magnitude of the DC current flowing from the second control unit 12 to the loop circuit 152.

A loop circuit 153 which is a loop-shaped circuit (a current path) is connected also to the reading unit 13, and the loop circuit 153 is magnetically coupled to the loop circuit

130 of the superconducting qubit circuit 10. The reading unit 13 is a circuit that reads out the state of the superconducting qubit circuit 10, that is, the state of the magnetic flux in the loop circuit 130, using the loop circuit 153.

Although the coupling circuit 20 according to the first example embodiment is used in FIG. 5, the coupling circuit 30 according to the second example embodiment may be used instead.

Figure 6:
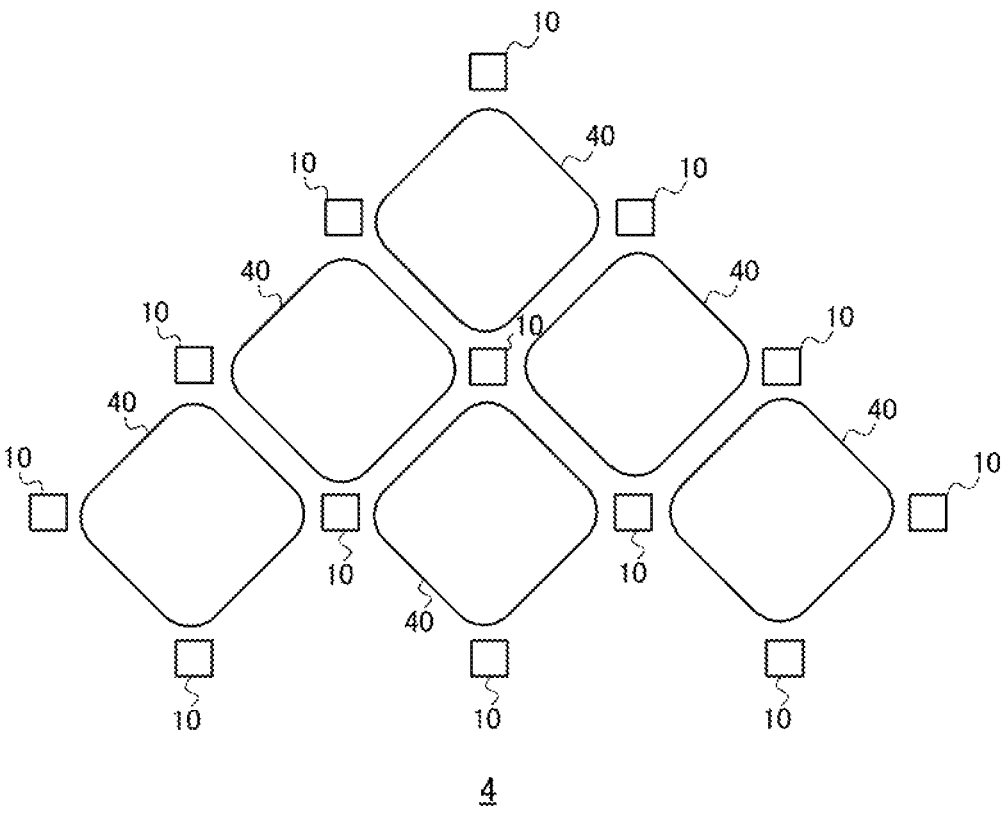
FIG. 6 is a schematic diagram showing a configuration of a quantum computer in which superconducting circuits are integrated.

Although the configuration shown in FIG. 5 shows the configuration of a quantum computer when there are four superconducting qubit circuits 10, more superconducting qubit circuits 10 may be integrated. It is possible to realize a quantum computer in which an arbitrary number of superconducting qubit circuits 10 are integrated by using the configuration shown in FIG. 5 as a unit structure and connecting a plurality of such unit structures side by side. That is, a quantum computer having the superconducting circuit 1 according to the first example embodiment or the superconducting circuit 2 according to the second example embodiment as a unit structure may be constituted. An example of the configuration is shown in FIG. 6. FIG. 6 is a schematic diagram showing a configuration of a quantum computer 4 in which the superconducting qubit circuits 10 are integrated. In FIG. 6, each of the coupling circuits 40 indicates either the coupling circuit 20 according to the first example embodiment described above or the coupling circuit 30 according to the second example embodiment described above. In FIG. 6, for clarity of the drawing, one loop representing four loop circuits 21 or 31 is shown as the coupling circuit 40. In the configuration shown in FIG. 6, as shown in FIGS. 1, 4, and 5, each coupling circuit 40 is connected to four superconducting qubit circuits 10. Further, each superconducting qubit circuit 10 is connected to one to four coupling circuits 40, and the superconducting qubit circuits 10 are arranged while shared (i.e., commonly used) by a plurality of unit structures, so that the unit structures shown in FIG. 5 is obtained. In the quantum computer 4, at least one superconducting qubit circuit 10 is connected to the plurality of coupling circuits 40. In particular, in the example shown in FIG. 6, at least one superconducting qubit circuit 10 is connected to the four coupling circuits 40. The quantum computer 4 can also be described as follows. The quantum computer 4 includes the plurality of superconducting qubit circuits 10, and each superconducting qubit circuit 10 is connected to one to four coupling circuits 40. The number of coupling circuits 40 to which respective superconducting qubit circuits 10 are connected corresponds to the number of unit structures in which these superconducting qubit circuits 10 are shared. Thus, in the example shown in FIG. 6, the quantum computer 4 includes a plurality of unit structures, and the superconducting qubit circuit 10 is shared by the plurality of unit structures. In the example shown in FIG. 6, 13 superconducting qubit circuits 10 are integrated, but any number of superconducting qubit circuits 10 can be integrated in a manner similar to this.

Although the first control unit 11, the second control unit 12, and the reading unit 13 are not shown in FIG. 6, the first control unit 11, the second control unit 12, and the reading unit 13 are actually used to control and read out the superconducting qubit circuit 10.

Figure 7:
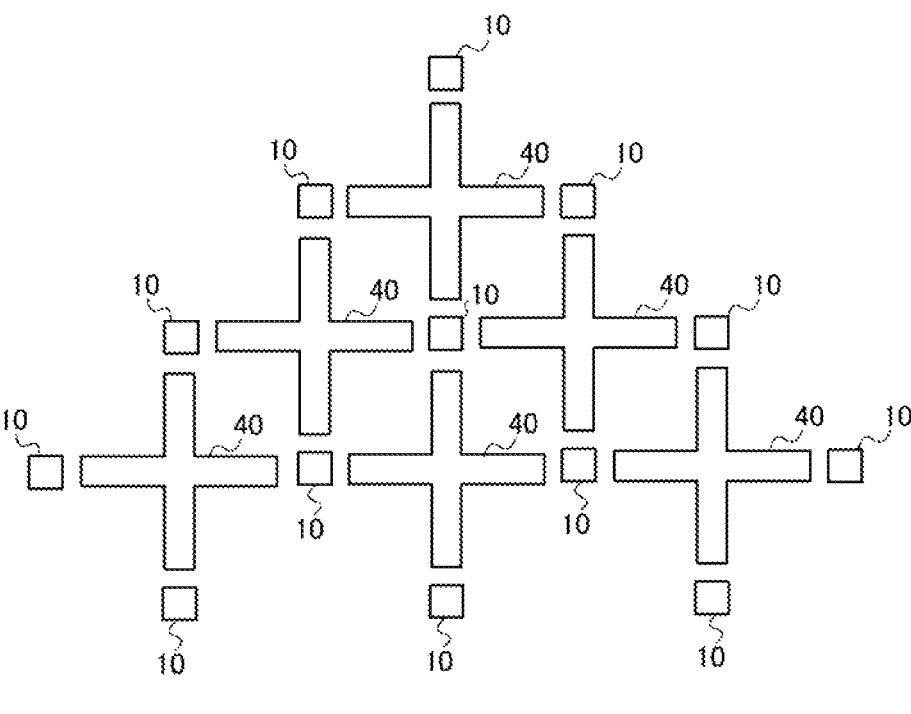
FIG. 7 is a schematic diagram showing a configuration of a quantum computer in which superconducting circuits are integrated.

In the configuration shown in FIG. 6, the superconducting qubit circuit 10 is disposed close to each vertex of the rectangular loop circuit 21 or loop circuit 31 constituting the coupling circuit 40, so that a unit structure in which four superconducting qubit circuits 10 are coupled is integrated. In order to integrate the unit structure, the loop circuit 21 or 31 (the coupling circuit 40) may have shapes other than a rectangle. For example, the loop circuit 21 or 31 (the coupling circuit 40) may be circular. When the loop circuit 21 or 31 (the coupling circuit 40 is circular, the four superconducting qubit circuits 10 may be arranged, for example, close to the four vertices of any rectangle, for example, a square, inscribed in the circular. The loop circuit 21 or 31 (the coupling circuit 40) may be cross-shaped as shown in FIG. 7. In FIG. 7, for the sake of clarity of the drawing, one loop representing four loop circuits 21 or 31 is shown as the coupling circuit 40. In this case, the four superconducting qubit circuits 10 are arranged close to each of four ends, which are, for example, parts protruding outward in the cross-shaped loop circuit.

According to this example embodiment, since the four-body interaction is implemented by the four superconducting qubit circuits instead of eight superconducting qubit circuits, a quantum computer with a reduced amount of hardware can be provided.

Note that the present disclosure is not limited to the above-described example embodiments, and may be appropriately modified without departing from the scope of the disclosure.

The whole or part of the example embodiments disclosed above can be described as, but not limited to, the following supplementary notes.

(Supplementary Note 1)

A superconducting circuit comprising:

four superconducting qubit circuits; and a coupling circuit inductively coupled to the four superconducting qubit circuits, wherein each of the superconducting qubit circuits indicates a qubit by being in a first phase state or a second phase state, when the number of the superconducting qubit circuits in the first phase state among the four superconducting qubit circuits is an even number, an interaction term of Hamiltonian of the superconducting circuit takes a first value, and when the number of the superconducting qubit circuits in the first phase state among the four superconducting qubit circuits is an odd number, the interaction term takes a second value.

(Supplementary Note 2)

The superconducting circuit according to Supplementary note 1, wherein the coupling circuit includes four loop circuits each including an inductor and a Josephson junction.

(Supplementary Note 3)

The superconducting circuit according to Supplementary note 2, wherein the inductor is a positive direction inductor inductively coupled to any of the superconducting qubit circuits and is inserted therein so that a current flows in the same direction as a direction of a current in the loop circuit or a reverse direction inductor inductively coupled to any of the superconducting qubit circuits and is inserted therein so that a current flows in a direction opposite to the direction of the current in the loop circuit, and a combination of types of the inductors used in the inductive coupling between one of the superconducting qubit circuit and the four loop circuits differs for each superconducting qubit circuit.

(Supplementary Note 4)

The superconducting circuit according to Supplementary note 3, wherein in the i-th loop circuit, where i is any integer from 1 to 4, among the four loop circuits, the Josephson junction is provided between two of the adjacent inductors, the two of the adjacent inductors being composed of the inductor inductively coupled to the j-th superconducting qubit circuit, where j is any integer from 1 to 4, among the four superconducting qubit circuits and the inductor inductively coupled to the k-th superconducting qubit circuit, where k is an integer from 1 to 4, and j and k have values different from each other, among the four superconducting qubit circuits, and in the loop circuits other than the i-th loop circuit among the four loop circuits, the Josephson junction is provided at a position other than between the two of the adjacent inductors composed of the inductor inductively coupled to the j-th superconducting qubit circuit among the four superconducting qubit circuits and the inductor inductively coupled to the k-th superconducting qubit circuit among the four superconducting qubit circuits.

(Supplementary Note 5)

The superconducting circuit according to Supplementary note 3 or 4, wherein the interaction term of the Hamiltonian of the superconducting circuit is expressed by the following formula.

In the following formula, $\varphi_1$, $\varphi_2$, $\varphi_3$, and $\varphi_4$ are phases of the four superconducting qubit circuits, $E_J$ is Josephson energy of the Josephson junction, and M is a mutual inductance of the superconducting qubit circuit and the loop circuit.

$$E_j \cos[M(\varphi_1+\varphi_2+\varphi_3+\varphi_4)]+E_J \cos[M(\varphi_1+(\varphi_2-\varphi_3-\varphi_4)]+E_j \cos[M(\varphi_1-\varphi_2+\varphi_3-\varphi_4)]+E_J \cos[M(\varphi_1-\varphi_2-\varphi_3+\varphi_4)]$$

(Supplementary Note 6)

The superconducting circuit according to Supplementary note 5, wherein the four superconducting qubit circuits are a first superconducting qubit circuit, a second superconducting qubit circuit, a third superconducting qubit circuit, and a fourth superconducting qubit circuit, respectively, the four loop circuits are a first loop circuit, a second loop circuit, a third loop circuit, and a fourth loop circuit, respectively, the first loop circuit includes:

the positive direction inductor inductively coupled to the first superconducting qubit circuit;

the positive direction inductor inductively coupled to the second superconducting qubit circuit;

the positive direction inductor inductively coupled to the third superconducting qubit circuit; and the positive direction inductor inductively coupled to the fourth superconducting qubit circuit, the second loop circuit includes:

the positive direction inductor inductively coupled to the first superconducting qubit circuit;

the positive direction inductor inductively coupled to the second superconducting qubit circuit;

the reverse direction inductor inductively coupled to the third superconducting qubit circuit; and the reverse direction inductor inductively coupled to the fourth superconducting qubit circuit, the third loop circuit includes:

the positive direction inductor inductively coupled to the first superconducting qubit circuit;

the reverse direction inductor inductively coupled to the second superconducting qubit circuit;

the positive direction inductor inductively coupled to the third superconducting qubit circuit; and the reverse direction inductor inductively coupled to the fourth superconducting qubit circuit, and the fourth loop circuit includes:

the positive direction inductor inductively coupled to the first superconducting qubit circuit;

the reverse direction inductor inductively coupled to the second superconducting qubit circuit;

the reverse direction inductor inductively coupled to the third superconducting qubit circuit; and the positive direction inductor inductively coupled to the fourth superconducting qubit circuit.

(Supplementary Note 7)

The superconducting circuit according to Supplementary note 3 or 4, wherein the interaction term of the Hamiltonian of the superconducting circuit is expressed by the following formula.

In the following formula, $\varphi_1$, $\varphi_2$, $\varphi_3$, and $\varphi_4$ are phases of the four superconducting qubit circuits, $E_J$ is Josephson energy of the Josephson junction, and M is a mutual inductance of the superconducting qubit circuit and the loop circuit.

$$E_j \cos[M(\varphi_1+\varphi_2+\varphi_3-\varphi_4)]+E_J \cos[M(\varphi_1+\varphi_2-\varphi_3+\varphi_4)]+$$
$$E_j \cos[M(\varphi_1-\varphi_2+\varphi_3+\varphi_4)]+E_J \cos[M(-\varphi_1+\varphi_2+$$
$$\varphi_3+\varphi_4)]$$

(Supplementary Note 8)

The superconducting circuit according to Supplementary note 7, wherein the four superconducting qubit circuits are a first superconducting qubit circuit, a second superconducting qubit circuit, a third superconducting qubit circuit, and a fourth superconducting qubit circuit, respectively, the four loop circuits are a first loop circuit, a second loop circuit, a third loop circuit, and a fourth loop circuit, respectively, the first loop circuit includes:

the reverse direction inductor inductively coupled to the first superconducting qubit circuit;

the positive direction inductor inductively coupled to the second superconducting qubit circuit;

the positive direction inductor inductively coupled to the third superconducting qubit circuit; and the positive direction inductor inductively coupled to the fourth superconducting qubit circuit, the second loop circuit includes:

the positive direction inductor inductively coupled to the first superconducting qubit circuit;

the reverse direction inductor inductively coupled to the second superconducting qubit circuit;

the positive direction inductor inductively coupled to the third superconducting qubit circuit; and the positive direction inductor inductively coupled to the fourth superconducting qubit circuit, the third loop circuit includes:

the positive direction inductor inductively coupled to the first superconducting qubit circuit;

the positive direction inductor inductively coupled to the second superconducting qubit circuit;

the reverse direction inductor inductively coupled to the third superconducting qubit circuit; and the positive direction inductor inductively coupled to the fourth superconducting qubit circuit, and the fourth loop circuit includes:

the positive direction inductor inductively coupled to the first superconducting qubit circuit;

the positive direction inductor inductively coupled to the second superconducting qubit circuit;

the positive direction inductor inductively coupled to the third superconducting qubit circuit; and the reverse direction inductor inductively coupled to the fourth superconducting qubit circuit.

(Supplementary Note 9)

A superconducting circuit comprising:

a plurality of superconducting qubit circuits; and a coupling circuit inductively coupled to the plurality of superconducting qubit circuits, wherein the coupling circuit includes a plurality of loop circuits each including an inductor and a Josephson junction, the inductor is a positive direction inductor inductively coupled to any of the superconducting qubit circuits and is inserted therein so that a current flows in the same direction as a direction of a current in the loop circuit or a reverse direction inductor inductively coupled to any of the superconducting qubit circuits and is inserted therein so that a current flows in a direction opposite to the direction of the current in the loop circuit, and a combination of types of the inductors used in the inductive coupling between one of the superconducting qubit circuits and the plurality of loop circuits differs for each superconducting qubit circuit.

(Supplementary Note 10)

A quantum computer comprising, as a unit structure, the superconducting circuit according to any one of Supplementary notes 1 to 9.

(Supplementary Note 11)

The quantum computer according to Supplementary note 10 comprising:

a plurality of the unit structures, wherein the superconducting qubit circuit is shared by the plurality of the unit structures.

(Supplementary Note 12)

The quantum computer according to Supplementary note 11, wherein the coupling circuit includes a rectangular shape, and the superconducting qubit circuit is shared by the plurality of unit structures by being arranged close to each vertex of the rectangular shape.

(Supplementary Note 13)

The quantum computer according to Supplementary note 11, wherein the coupling circuit includes a cross shape, and the superconducting qubit circuit is shared by the plurality of unit structures by being arranged close to ends of the cross shape projecting outward.

Although the present disclosure has been described with reference to the example embodiments, the present disclosure is not limited to the above. The configurations and details of the present disclosure may be modified in various ways that could be understood by those skilled in the art within the scope of the disclosure.

This application claims priority on the basis of Japanese Patent Application No. 2019-133818, filed Jul. 19, 2019, the entire disclosure of which is incorporated herein by reference.

REFERENCE SIGNS LIST

1 SUPERCONDUCTING CIRCUIT
2 SUPERCONDUCTING CIRCUIT
3 QUANTUM COMPUTER
4 QUANTUM COMPUTER
10 SUPERCONDUCTING QUBIT CIRCUIT
11 FIRST CONTROL UNIT

12 SECOND CONTROL UNIT
13 READING UNIT
20 COUPLING CIRCUIT
21 LOOP CIRCUIT
22 JOSEPHSON JUNCTION
23 INDUCTOR
30 COUPLING CIRCUIT
31 LOOP CIRCUIT
32 JOSEPHSON JUNCTION
33 INDUCTOR
40 COUPLING CIRCUIT
101 FIRST SUPERCONDUCTING LINE
102 SECOND SUPERCONDUCTING LINE
103 FIRST JOSEPHSON JUNCTION
104 SECOND JOSEPHSON JUNCTION
105 FIRST PART
106 SECOND PART
110 LOOP CIRCUIT
120 INDUCTOR
130 LOOP CIRCUIT
151 LOOP CIRCUIT
152 LOOP CIRCUIT
153 LOOP CIRCUIT

The invention claimed is:

1. A superconducting circuit comprising:

four superconducting qubit circuits; and a coupling circuit inductively coupled to the four superconducting qubit circuits, wherein each of the four superconducting qubit circuits indicates a qubit by being in a first phase state or a second phase state, wherein, when the number of the four superconducting qubit circuits in the first phase state among the four superconducting qubit circuits is an even number, an interaction term of a Hamiltonian of the superconducting circuit takes a first value, wherein, when the number of the four superconducting qubit circuits in the first phase state among the four superconducting qubit circuits is an odd number, the interaction term takes a second value, wherein the coupling circuit comprises four loop circuits independent of each other, each of the four loop circuits comprising an inductor and a Josephson junction, and wherein the four superconducting qubit circuits are a first superconducting qubit circuit, a second superconducting qubit circuit, a third superconducting qubit circuit, and a fourth superconducting qubit circuit, respectively, wherein:

the first superconducting qubit circuit is inductively coupled to each of the four loop circuits, the second superconducting qubit circuit is inductively coupled to each of the four loop circuits, the third superconducting qubit circuit is inductively coupled to each of the four loop circuits, and the fourth superconducting qubit circuit is inductively coupled to each of the four loop circuits, the inductor is a positive direction inductor inductively coupled to any of the four superconducting qubit circuits and is inserted therein so that a current flows in the same direction as a direction of a current in the four loop circuits or a reverse direction inductor inductively coupled to any of the four superconducting qubit circuits and is inserted therein so that a current flows in a direction opposite to the direction of the current in the four loop circuits, and a combination of types of the inductors used in the inductive coupling between one of the four superconducting qubit circuits and the four loop circuits differs for each of the four superconducting qubit circuits, in the i-th loop circuit, where i is any integer from 1 to 4, among the four loop circuits, the Josephson junction is provided between two adjacent ones of the inductors, the two adjacent ones of the inductors being composed of the inductor inductively coupled to the j-th superconducting qubit circuit, where j is any integer from 1 to 4, among the four superconducting qubit circuits and the inductor inductively coupled to the k-th superconducting qubit circuit, where k is an integer from 1 to 4, and j and k have values different from each other, among the four superconducting qubit circuits, and in the four loop circuits other than the i-th loop circuit among the four loop circuits, the Josephson junction is provided at a position other than between the two adjacent ones of the inductors composed of the inductor inductively coupled to the j-th superconducting qubit circuit among the four superconducting qubit circuits and the inductor inductively coupled to the k-th superconducting qubit circuit among the four superconducting qubit circuits.

2. A superconducting circuit comprising:

four superconducting qubit circuits; and a coupling circuit inductively coupled to the four superconducting qubit circuits, wherein each of the four superconducting qubit circuits indicates a qubit by being in a first phase state or a second phase state, wherein, when the number of the four superconducting qubit circuits in the first phase state among the four superconducting qubit circuits is an even number, an interaction term of a Hamiltonian of the superconducting circuit takes a first value, wherein, when the number of the four superconducting qubit circuits in the first phase state among the four superconducting qubit circuits is an odd number, the interaction term takes a second value, wherein the coupling circuit comprises four loop circuits independent of each other, each of the four loop circuits comprising an inductor and a Josephson junction, and wherein the four superconducting qubit circuits are a first superconducting qubit circuit, a second superconducting qubit circuit, a third superconducting qubit circuit, and a fourth superconducting qubit circuit, respectively, wherein:

the first superconducting qubit circuit is inductively coupled to each of the four loop circuits, the second superconducting qubit circuit is inductively coupled to each of the four loop circuits, the third superconducting qubit circuit is inductively coupled to each of the four loop circuits, and the fourth superconducting qubit circuit is inductively coupled to each of the four loop circuits, the inductor is a positive direction inductor inductively coupled to any of the four superconducting qubit circuits and is inserted therein so that a current flows in the same direction as a direction of a current in the four loop circuits or a reverse direction inductor inductively coupled to any of the four superconducting qubit circuits and is inserted therein so that a current flows in a direction opposite to the direction of the current in the four loop circuits, and a combination of types of the inductors used in the inductive coupling between one of the four superconducting qubit circuits and the four loop circuits differs for each of the four superconducting qubit circuits, and the interaction term of the Hamiltonian of the superconducting circuit is expressed by the following formula, wherein q1 is a phase of the first superconducting qubit circuit and indicates the first phase state or the second phase state, $\varphi_2$ is a phase of the second superconducting qubit circuit and indicates the first phase state or the second phase state, $\varphi_3$ is a phase of the third superconducting qubit circuit and indicates the first phase state or the second phase state, $\varphi_4$ is a phase of the fourth superconducting qubit circuit and indicates the first phase state or the second phase state, $E_J$ is Josephson energy of the Josephson junction, and M is a mutual inductance between the four superconducting qubit circuits and the four loop circuits:

$$E_J \cos[M(\varphi_1+\varphi_2+\varphi_3-\varphi_4)]+E_J \cos[M(\varphi_1+\varphi_2-\varphi_3+\varphi_4)]+ \\ E_J \cos[M(\varphi_1-\varphi_2+\varphi_3+\varphi_4)]+E_J \cos[M(-\varphi_1+\varphi_2+ \\ \varphi_3+\varphi_4)]$$

3. The superconducting circuit according to claim 2, wherein:

the four loop circuits are a first loop circuit, a second loop circuit, a third loop circuit, and a fourth loop circuit, respectively, the first loop circuit includes:

the positive direction inductor inductively coupled to the first superconducting qubit circuit;

the positive direction inductor inductively coupled to the second superconducting qubit circuit;

the positive direction inductor inductively coupled to the third superconducting qubit circuit; and the positive direction inductor inductively coupled to the fourth superconducting qubit circuit, the second loop circuit includes:

the positive direction inductor inductively coupled to the first superconducting qubit circuit;

the positive direction inductor inductively coupled to the second superconducting qubit circuit;

the reverse direction inductor inductively coupled to the third superconducting qubit circuit; and the reverse direction inductor inductively coupled to the fourth superconducting qubit circuit, the third loop circuit includes:

the positive direction inductor inductively coupled to the first superconducting qubit circuit;

the reverse direction inductor inductively coupled to the second superconducting qubit circuit;

the positive direction inductor inductively coupled to the third superconducting qubit circuit; and the reverse direction inductor inductively coupled to the fourth superconducting qubit circuit, and the fourth loop circuit includes:

the positive direction inductor inductively coupled to the first superconducting qubit circuit;

the reverse direction inductor inductively coupled to the second superconducting qubit circuit;

the reverse direction inductor inductively coupled to the third superconducting qubit circuit; and the positive direction inductor inductively coupled to the fourth superconducting qubit circuit.

4. A superconducting circuit comprising:

four superconducting qubit circuits; and a coupling circuit inductively coupled to the four superconducting qubit circuits, wherein each of the four superconducting qubit circuits indicates a qubit by being in a first phase state or a second phase state, wherein, when the number of the four superconducting qubit circuits in the first phase state among the four superconducting qubit circuits is an even number, an interaction term of a Hamiltonian of the superconducting circuit takes a first value, wherein, when the number of the four superconducting qubit circuits in the first phase state among the four superconducting qubit circuits is an odd number, the interaction term takes a second value, wherein the coupling circuit comprises four loop circuits independent of each other, each of the four loop circuits comprising an inductor and a Josephson junction, and wherein the four superconducting qubit circuits are a first superconducting qubit circuit, a second superconducting qubit circuit, a third superconducting qubit circuit, and a fourth superconducting qubit circuit, respectively, wherein:

the first superconducting qubit circuit is inductively coupled to each of the four loop circuits, the second superconducting qubit circuit is inductively coupled to each of the four loop circuits, the third superconducting qubit circuit is inductively coupled to each of the four loop circuits, and the fourth superconducting qubit circuit is inductively coupled to each of the four loop circuits, the inductor is a positive direction inductor inductively coupled to any of the four superconducting qubit circuits and is inserted therein so that a current flows in the same direction as a direction of a current in the four loop circuits or a reverse direction inductor inductively coupled to any of the four superconducting qubit circuits and is inserted therein so that a current flows in a direction opposite to the direction of the current in the four loop circuits, and a combination of types of the inductors used in the inductive coupling between one of the four superconducting qubit circuits and the four loop circuits differs for each of the four superconducting qubit circuits, the interaction term of the Hamiltonian of the superconducting circuit is expressed by the following formula, wherein $\varphi_1$ is a phase of the first superconducting qubit circuit and indicates the first phase state or the second phase state, $\varphi_2$ is a phase of the second superconducting qubit circuit and indicates the first phase state or the second phase state, $\varphi_3$ is a phase of the third superconducting qubit circuit and indicates the first phase state or the second phase state, $\varphi_4$ is a phase of the fourth superconducting qubit circuit and indicates the first phase state or the second phase state, $E_j$ is Josephson energy of the Josephson junction, and M is a mutual inductance between the four superconducting qubit circuits and the four loop circuits:

$$E_J \cos[M(\varphi_1+\varphi_2+\varphi_3-\varphi_4)]+E_J \cos[M(\varphi_1+\varphi_2-\varphi_3+\varphi_4)]+ \\ E_J \cos[M(\varphi_1-\varphi_2+\varphi_3+\varphi_4)]+E_J \cos[M(-\varphi_1+\varphi_2+ \\ \varphi_3+\varphi_4)]$$

5. The superconducting circuit according to claim 4, wherein:

the four loop circuits are a first loop circuit, a second loop circuit, a third loop circuit, and a fourth loop circuit, respectively, the first loop circuit includes:

the reverse direction inductor inductively coupled to the first superconducting qubit circuit;

the positive direction inductor inductively coupled to the second superconducting qubit circuit;

the positive direction inductor inductively coupled to the third superconducting qubit circuit; and the positive direction inductor inductively coupled to the fourth superconducting qubit circuit, the second loop circuit includes:

the positive direction inductor inductively coupled to the first superconducting qubit circuit;

the reverse direction inductor inductively coupled to the second superconducting qubit circuit;

the positive direction inductor inductively coupled to the third superconducting qubit circuit; and the positive direction inductor inductively coupled to the fourth superconducting qubit circuit, the third loop circuit includes:

the positive direction inductor inductively coupled to the first superconducting qubit circuit;

the positive direction inductor inductively coupled to the second superconducting qubit circuit;

the reverse direction inductor inductively coupled to the third superconducting qubit circuit; and the positive direction inductor inductively coupled to the fourth superconducting qubit circuit, and the fourth loop circuit includes:

the positive direction inductor inductively coupled to the first superconducting qubit circuit;

the positive direction inductor inductively coupled to the second superconducting qubit circuit;

the positive direction inductor inductively coupled to the third superconducting qubit circuit; and the reverse direction inductor inductively coupled to the fourth superconducting qubit circuit.

6. A quantum computer comprising, as a unit structure, the superconducting circuit according to claim 1.

7. The quantum computer according to claim 6 comprising:

a plurality of the unit structures, wherein one or more of the four superconducting qubit circuits is shared by the plurality of the unit structures.

8. The quantum computer according to claim 7, wherein:

the coupling circuit includes a rectangular shape, and the one or more of the four superconducting qubit circuits is shared by the plurality of unit structures by being arranged close to each vertex of the rectangular shape.

9. The quantum computer according to claim 7, wherein:

the coupling circuit includes a cross shape, and the one or more of the four superconducting qubit circuits is shared by the plurality of unit structures by being arranged close to ends of the cross shape projecting outward.

* * * * *